United States Patent
Carson

(12) 
(10) Patent No.: US 6,468,830 B1
(45) Date of Patent: Oct. 22, 2002

(54) COMPLIANT SEMICONDUCTOR PACKAGE WITH ANISOTROPIC CONDUCTIVE MATERIAL INTERCONNECTS AND METHODS THEREFOR

(75) Inventor: Flynn Carson, Redwood City, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/237,072

(22) Filed: Jan. 25, 1999

Related U.S. Application Data

(60) Provisional application No. 60/072,496, filed on Jan. 26, 1998.

(51) Int. Cl.[7] ............................................. H01L 21/44
(52) U.S. Cl. ..................... 438/106; 438/125; 438/107; 438/118; 438/127; 438/119
(58) Field of Search ................... 438/106, 119, 438/125, 107, 118, 127

(56) References Cited

U.S. PATENT DOCUMENTS

| | | | |
|---|---|---|---|
| 4,729,809 A | 3/1988 | Dery et al. ............... | 156/306.6 |
| 4,955,132 A | 9/1990 | Ozawa | |
| 5,001,542 A | 3/1991 | Tsukagoshi et al. | |
| 5,148,265 A | 9/1992 | Khandros et al. | |
| 5,148,266 A | 9/1992 | Khandros et al. | |
| 5,225,966 A * | 7/1993 | Basavanhally et al. | |
| 5,347,159 A | 9/1994 | Khandros et al. | |
| 5,428,190 A | 6/1995 | Stopperan ................... | 174/261 |
| 5,431,571 A | 7/1995 | Hanrahan et al. | |
| 5,518,964 A | 5/1996 | DiStefano et al. .......... | 437/209 |
| 5,631,191 A * | 5/1997 | Durand et al. | |
| 5,657,206 A | 8/1997 | Pedersen et al. ............. | 361/772 |
| 5,679,977 A | 10/1997 | Khandros et al. ........... | 257/692 |
| 5,685,885 A | 11/1997 | Khandros et al. | |
| 5,749,997 A | 5/1998 | Tang et al. | |
| 5,848,467 A | 12/1998 | Khandros et al. | |
| 5,852,326 A | 12/1998 | Khandros et al. | |
| 5,904,498 A * | 5/1999 | Fjelstad | |
| 5,933,712 A | 8/1999 | Bernhardt et al. .......... | 438/125 |
| 5,989,936 A * | 11/1999 | Smith et al. | |
| 6,093,970 A * | 7/2000 | Ohsawa et al. | |

OTHER PUBLICATIONS

Tummala et al., Microelectronics Packaging Handbook, 1997, Chapman & Hall, vol. III, pp. 228–234.*

* cited by examiner

*Primary Examiner*—David E. Graybill
*Assistant Examiner*—James Mitchell
(74) *Attorney, Agent, or Firm*—Lerner, David, Littenberg, Krumholz & Mentlik, LLP

(57) ABSTRACT

A microelectronic package includes first and second microelectronic elements in spaced apart relationship which are electrically interconnected by a plurality of flexible leads and a layer of anisotropic conductive material. The flexible leads having one end attached to terminals on one of the microelectronic elements extends away therefrom having its opposite tip end electrically interconnected to contacts on the other microelectronic element by virtue of an interposed layer of the anisotropic conductive material.

16 Claims, 3 Drawing Sheets

COMPLIANT SEMICONDUCTOR PACKAGE WITH ANISOTROPIC CONDUCTIVE MATERIAL INTERCONNECTS AND METHODS THEREFOR

The present application claims the benefit of United States Provisional Application No. 60/072,496, filed Jan. 26, 1998, the disclosure of which is hereby incorporated by reference herein.

FIELD OF THE INVENTION

The present invention relates to the field of semiconductor chip mounting and connection, and more particularly, relates to semiconductor chip packages including flexible leads having enhanced fatigue-resistant and to assembly methods therefor.

BACKGROUND OF THE INVENTION

Semiconductor chips are connected to external circuitry through electrical contacts on a front face of the chip. Each contact on the chip must be connected to external circuitry, such as the circuitry of a supporting substrate or circuit panel. Various processes for making these interconnections use prefabricated arrays of leads or discrete wires. For example, in the so-called tape automated bonding or "TAB" process, a dielectric supporting tape, such as a thin foil of polyimide includes an array of metallic leads on one surface of the dielectric film. These leads are aligned with the contacts on the front face of the chip. The dielectric film is juxtaposed with the chip so that the leads extend over the front or contact bearing surface on the chip. The leads are then bonded to the contacts of the chip, as by ultrasonic or thermocompression bonding. The terminals on the dielectric film may then be connected to external circuitry for electrically interconnecting the chip and the external circuitry.

The rapid evolution of the semiconductor art in recent years has created a continued demand for semiconductor chip packages having progressively greater numbers of contacts and leads in a given amount of space. An individual chip may require hundreds or even thousands of contacts, all within the area of the front face of the chip. Certain complex semiconductor chips currently being used have contacts spaced apart from one another at center-to-center distances of 0.1 mm or less and, in some cases, 0.05 mm or less. With such closelyspaced contacts the leads connected to the chip contacts must be extremely fine structures, typically having a smaller bonded surface than the contacts onto which they are bonded so that the adjacent leads do not electrically short. Such fine structures are susceptible to damage and deformation.

U.S. Pat. No. 5,489,749, the disclosure of which is incorporated by reference herein, describes an improved system for connecting semiconductor chips to external circuitry. Certain disclosed embodiments of the invention utilize a connection component including a flexible dielectric sheet and electrically conductive leads. Each lead has a connection section extending across a gap in the dielectric sheet. The connection sections of the leads are flexible. Preferably, one end of each lead, sometimes referred to as the tip end, is detachably secured to the dielectric sheet, whereas the other end is permanently secured to the dielectric sheet and connected to a terminal mounted on the dielectric sheet. The connection sections of the leads are bonded to the contacts on the chip by engaging each connection section with a tool, forcing the tool downwardly to break the tip end of the lead from the dielectric sheet and bringing the connection section into engagement with a contact on the chip.

Leads are typically bonded to contacts on a semiconductor chip or other microelectronic element using ultrasonic, thermocompression or thermosonic bonding. In the bonding process, the bonding region of each lead is engaged by a bonding tool which bears on the top surface of the lead in the bonding region and forces the lead downwardly into engagement with the contact. Energy supplied through the bonding tool causes the bonding metal to join with the contact. Typically, the leads are bonded to the chip contacts with the bonding tool using heat, force, ultrasonic energy, or a combination of two or more thereof, for a given time period. If incorrect force, heat and/or ultrasonic energy is used, the bond between the leads and the contacts may be too weak to withstand thermal cycling stresses during operation of the chip (heating and cooling cycles during operation). Also, the bonding tool may create areas of the lead which are prone to early fatigue during thermal cycling because of excessive non-uniform deformations in the bonding region typically causing early breaks in the lead at the point the lead bends up from the chip surface (commonly referred to as a "heel break").

Copending U.S. patent application Ser. No. 09/179,273 filed Oct. 27, 1998 is incorporated by reference herein. In certain structures taught in said copending application, a connection component includes flexible leads incorporating a structural material such as copper, gold, alloys of these metals or other metals. Each lead is provided with a thin layer of a fatigue-resistant alloy, such as the alloys commonly referred to as shape memory alloys. The fatigue resistant alloy preferably is provided on the bonding or bottom side of the lead which is bonded to a contact during use of the component. A layer of a readily bondable material such as gold, palladium or other metal compatible with the contact to which the lead is to be bonded is applied on the bottom or bond side of the lead covering the fatigue-resistant alloy at least in the area of the lead which will engage the contact during use.

Akagawa, U.S. Pat. No. 5,677,576 discloses a semiconductor package including a semiconductor chip having one surface provided with an insulating passivation film having openings exposing aluminum contact pads formed on the surface of the semiconductor chip in a predetermined pattern. An anisotropic conductive sheet is formed over the passivation film and the contact pads. The anisotropic conductive sheet is formed of a resin containing conductive fillers such as metallic powders whereby the application of pressure to the film results in electrical conductivity in the pressed direction due to the continuity of the conductive fillers caused by the pressure. The metallic powders may be, for example, metallic particles in the nature of resin particles coated with nickel plated layers or the like or metallic particles such as of gold, nickel or the like.

Electrical conductive circuit patterns are formed in a predetermined arrangement on the exposed surface of the anisotropic conductive sheet. The circuit patterns are formed by adhering a metallic foil, such as a copper foil to the anisotropic conductive sheet and etching the foil in conformity with the predetermined circuit patterns. A photoresist film is deposited over the anisotropic conductive sheet and the circuit patterns. The photoresist film is provided with openings in the nature of via holes for receiving conductive bumps to provide external termination to the circuit patterns. By compressing the anisotropic conductive sheet in the region overlying the contact pads, electrical continuity to the circuit patterns is provided.

Tang, et al., U.S. Pat. No. 5,749,997 discloses another semiconductor device using an anisotropic conductive sheet. The device includes a semiconductor chip supporting on its major surface a plurality of composite bumps. The bumps are formed of a polymer body such as polyamic acid polyimide covered by a conductive metal coating such as a composite of chrome/gold or nickel/gold. An anisotropic conductive sheet is compressed over the composite bumps and the surface of the semiconductor chip. A dielectric layer having leads formed thereon such as in the conventional TAB or tape automated bonding process is arranged overlying the surface of the anisotropic conductive sheet. The leads may be fully supported by the dielectric sheet, or have portions extending within a window formed within the sheet. In either event, the dielectric sheet is arranged with the leads having one end overlying each of the composite bumps. Upon compression of the anisotropic conductive sheet, the conductive particles therein will make electrical contact with the leads and the conductive metal coating on the composite bumps.

Chillara, U.S. Pat. No. 5,627,405 discloses an anisotropic conductive sheet adhered to the surface of an integrated circuit semiconductor chip which includes a plurality of input/output terminals. The anisotropic conductive sheet is used to electrically couple the semiconductor chip directly to terminals on a printed circuit board, to leads of a lead frame, to traces on various substrate structures and the like.

Notwithstanding the foregoing known use of an anisotropic conductive sheet, there is still the need for improvements in microelectronic packages and methods of manufacturing same. In particular, there is the need for improvements in microelectronic packages having flexible leads which eliminate metal-to-metal bonding which is known to require the use of high temperature/pressures during thermocompression or thermosonic bonding. There is further the need for providing improved methods for making such microelectronic packages which will minimize deformation of the flexible leads thereby minimizing the potential for fatigue problems. Still further, there is the need for such microelectronic packages and methods for manufacturing same which provide for the use of narrow flexible leads which enables the obtaining of very fine pitches so as to accommodate more leads in a given space.

SUMMARY OF THE INVENTION

In accordance with one embodiment of the present invention there is described a microelectronic package comprising a first microelectronic element having a front face including a plurality of contacts and a second microelectronic element including terminals accessible at a surface thereof and a plurality of flexible leads. Each of the flexible leads have a terminal end connected to one of the terminals and a tip end opposite the terminal end. Further, each flexible lead extends away from the second microelectronic element and is electrically interconnected with the plurality of contacts of the first microelectronic element. An anisotropic conductive material is interposed between each of the tip ends of the flexible leads and the contact associated therewith.

In accordance with another embodiment of the present invention there is described a method of making a microelectronic package comprising the steps of providing a first microelectronic element having a front face including a plurality of contacts. An anisotropic conductive material is provided over each one of the plurality of contacts. A second microelectronic element is provided having terminals accessible at a surface thereof and including a plurality of flexible leads. Each of the leads has a terminal end attached to one of the terminals and a tip end offset from the terminal end. The first and second microelectronic elements are juxtaposed with one another. The tip ends of the flexible leads and the contacts are electrically interconnected so that the flexible leads extend away from the second microelectronic element with the anisotropic conductive material interposed between the tip ends and the contacts.

BRIEF DESCRIPTION OF THE DRAWINGS

The above description, as well as further objects, features and advantages of the present invention will be more fully understood with reference to the following detailed description of compliant semiconductor package with anisotropic conductive material interconnects and methods therefor, when taken in conjunction with the accompanying drawings, wherein.

DETAILED DESCRIPTION OF PREFERRED EMBODIMENTS

Figure 1:
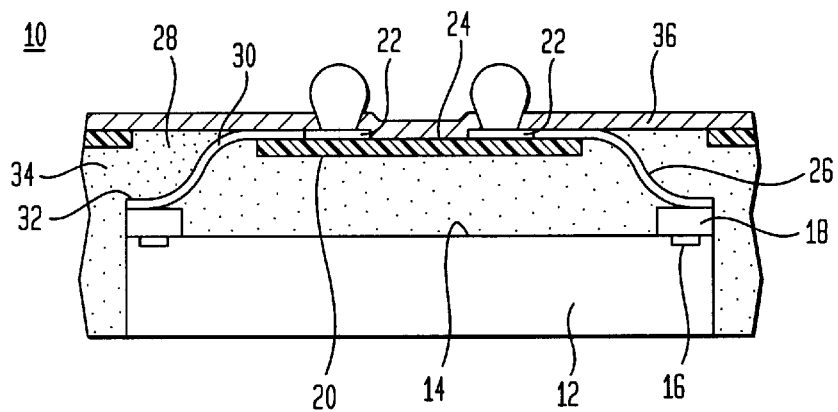
FIG. 1 is a side view of a semiconductor chip including an anisotropic conductive material according to one embodiment of the present invention.

Referring now to the drawings, wherein like reference numerals represent like elements, there is shown in FIG. 1 a microelectronic package, i.e., a semiconductor chip package, generally designated by reference numeral 10. The semiconductor chip package 10 which includes an anisotropic conductive material in accordance with one embodiment of the present invention will now be described. As shown in FIG. 1, the semiconductor chip package 10 includes a semiconductor chip 12 having a generally planar front face 14 including electrical parts or contacts 16 formed on peripheral regions of the front face. Other types of semiconductor chips 12 may also be used such as chips having contacts disposed in an "area array", i.e., an array covering substantially the entire front face of the chip with the contacts being uniformly spaced within the array. In the particular chip package 10 shown, the contacts 16 are arranged in rows (not shown) which are adjacent and run parallel to each edge of the chip. The contacts 16 in each row are spaced at very close intervals, typically about 100 to about 250 micrometers center-to-center. The semiconductor chip 12 may include a passivation film (not shown) formed of $SiO_2$, SiN or the like. The passivation film is not formed in areas where the contacts 16 exist so that the contacts are be exposed in these areas.

An anisotropic conductive material 18 is provided over each contact 16 on the front face 14 of the semiconductor chip 12. The anisotropic conductive material 18 is preferably provided as a plurality of individual masses, with one individual mass of the material being provided over one of the contacts 16 associated therewith. In other embodiments, the anisotropic conductive material 18 may be provided as a continuous layer which is provided over substantially all of the contacts 16 or may be provided as strips provided over one or more rows of contacts. In any event, the contacts 16 are covered with a layer of anisotropic conductive material 18. The anisotropic conductive material 18 is preferably a polymeric resin having a matrix of conductive particles therein, such as the conductive particles 19 shown in FIG. 2B. The anisotropic conductive material 18 may also comprise a polymeric layer with a thin coating of metal, such as nickel or gold, on the outer surfaces thereof.

By the application of pressure, the anisotropic conductive material 19 becomes conductive in the pressed direction due to the continuity of the conductive material, for example, the metallic powders, caused by the pressure. The conductive particles 19 may include metallic powders such as nickel or gold. The metallic powders may also be, for example, metallic particles consisting of resin particles coated with Ni plated layers or the like, or solid metallic particles consisting of Au, Ni or the like. The particles may, for example, be in the size range of from about 3 to 15 microns, preferably as solid balls of Ni or Au. One suitable anisotropic conductive material includes the material sold under the tradename "FC-262B" by the Hitachi Chemical Company. The exact composition and characteristics of the FC-262B anisotropic conductive material are set forth in more detail in the chemical data sheet for the FC-262B material, which is incorporated herein by reference.

The semiconductor chip package also includes a connection component, such as a flexible dielectric sheet 20 juxtaposed with the front face 14 of the semiconductor chip 12. The flexible dielectric sheet 20 is preferably formed from a polymeric material having an approximate thickness between 25 and 75 microns. The flexible dielectric sheet 20 has conductive terminals 22 at its second or exterior surface 24 and electrical parts or flexible leads 26 extending from the terminals 22 for electrically connecting the terminals 22 to the contacts 16 on the semiconductor chip 12. The present invention can be employed with various lead configurations, including conventional tape automated bonding leads and the leads depicted in U.S. Pat. Nos. 5,489,749, 5,491,302 and 5,629,239, the disclosures of which are hereby incorporated by reference herein. As further discussed in these patents, the leads can be provided on dielectric layers such that the leads extend into or across gaps in the dielectric layers and so that the leads can be bent downwardly towards contacts on the surface, to form a bent configuration as depicted in the drawings disclosed therein. The invention can also be employed in flexible leads which include a polymer layer such as the leads disclosed in International Publications WO 94/03036 and WO 97/11588, the disclosures of which are hereby incorporated by reference herein.

The flexible dielectric sheet 20 preferably includes bond windows 28 for accessing the leads 26 for electrically connecting the leads 26 with the contacts 16. Each flexible lead 26 preferably has a first end or terminal end 30 connected to one of the terminals 22 and a second end or tip end 32 remote from the terminal end 30. The leads 26 are typically lithographically defined on the flexible dielectric sheet 20. The terminals 22 and leads 26 may be formed from substantially any electrically conductive material, but preferably are formed from metallic materials such as copper and copper alloys, noble metals and noble metal alloys and are typically fabricated by conventional photolithographic end etching or deposition techniques. By way of example, the leads may have a center-to-center spacing of about 0.05 mm or less.

Figure 2A:
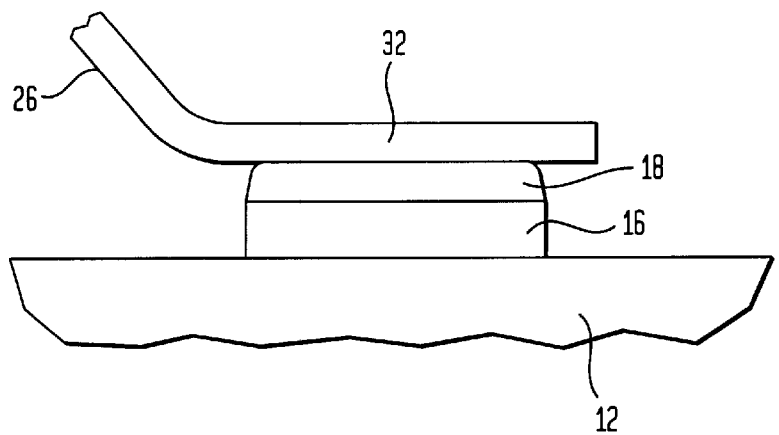
FIGS. 2A and 2B show respective side and end views of a lead attached to anisotropic conductive material in accordance with certain preferred embodiments of the present invention.
Figure 2B:
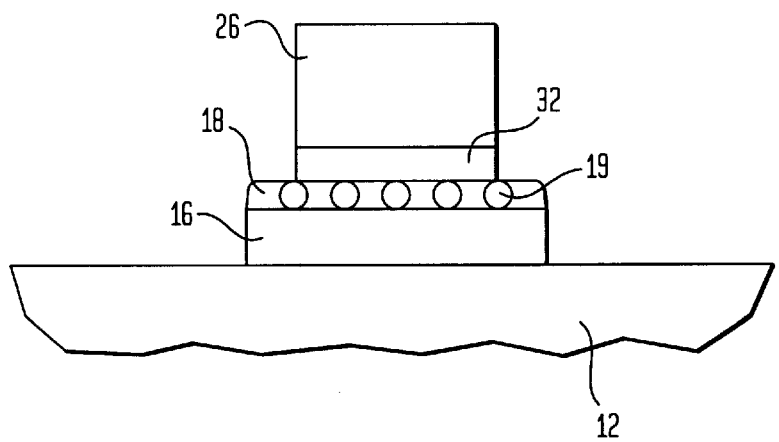

Referring to FIGS. 1, 2A and 2B, the flexible dielectric sheet 20 is preferably juxtaposed with the front face 14 of the chip 12. The semiconductor chip 12 and the flexible dielectric sheet 20 are then electrically interconnected by connecting the tip ends 32 of the flexible leads 26 to the anisotropic conductive material 18 directly over the contacts 16 of the semiconductor chip 12. During the bonding operation, the tip ends 32 of the flexible leads 26 are broken away from or peeled away from the flexible dielectric sheet 20. The tip end 32 of each lead 26 is then urged toward the anisotropic conductive material 18 and the contact 16 associated therewith. As the tip ends 32 of the flexible leads 26 are urged toward the contacts 16, the flexible leads bend downward so that the flexible leads extend generally vertically away from the flexible dielectric sheet 20.

The anisotropic conductive material 18 preferably formed as an adhesive so that the tip ends 32 may be effectively adhered to the anisotropic conductive material 18 and electrically interconnected with the contacts 16 while applying a minimal amount of heat and pressure to the tip ends and the anisotropic material. After the bonding step, the anisotropic conductive material 18, which is interposed between the tip ends 32 of the leads 26 and the contacts 16, provides electrical interconnection between the leads 26 and the contacts 16. The distance between the tip end 32 of each lead 26 and the contact 16 associated therewith is preferably as small as possible because the anisotropic conductive material 18 is, generally a relatively poor conductor of electricity. The anisotropic conductive material 18 is preferably deformable. In certain preferred embodiments, the tip ends 32 of the leads 26 may be pushed into or sunk into the deformable anisotropic conductive material 18 so that the anisotropic material 18 partially surrounds the tip ends 32 after the bonding step.

There are a number of advantages associated with using an anisotropic conductive material 18 for electrically connecting the flexible leads 26 and chip contacts 16. First, there is no metal-to-metal ("intermetallic") bonding requiring the use of high temperatures/pressures during thermocompression or thermosonic bonding. In addition, when using an anisotropic conductive material 18 to attach the leads to the contacts 16, lower temperatures and pressures will be required to make the connections. The lower temperatures and pressures will minimize deformation of the flexible leads 26 which, in turn, will minimize the potential for the fatigue problems described above. Another benefit of bonding at lower temperatures and pressures is that finer flexible leads may be used which will enable even finer pitches to be obtained (i.e., more leads in the same space). In addition, preferred embodiments of the present invention use relatively thin layers of anisotropic conductive material 18 between the contacts 16 and the leads 26. The package 10 is rendered compliant due, in part, to the flexible leads 26 and the compliant layer as to be described. This is an improvement over prior art structures which use relatively thick layers of anisotropic conductive material 18 between the leads 26 and the contacts 16.

Further in accordance with one embodiment of the process of the present invention, a low elastic modulus dielectric encapsulant or compliant filler material 34, such as a liquid silicone rubber or other curable elastomer, is allowed to flow between the flexible dielectric sheet 20 and the chip 12 and around the flexible leads 26 while the chip 12 and the flexible dielectric sheet 20 are compressed together or held in place. A mask or coverlay 36 may be placed over the bond windows 28 to prevent the uncured encapsulant 34 from flowing through the bond windows 28 during the encapsulation process. The encapsulant 34 is then cured by using energy such as heat, ultraviolet light or other radiant energy to form a substantially uniform planar compliant layer between the chip 12 and the dielectric sheet 20. Because the encapsulant 34 is applied only after the tip ends 32 of the flexible leads 26 have been connected to the anisotropic conductive material 18, there is minimal risk of the encapsulant 34 contacting the tip ends 32 of the flexible leads 26 before the connection which could diminish the strength of the connection.

Figure 3:
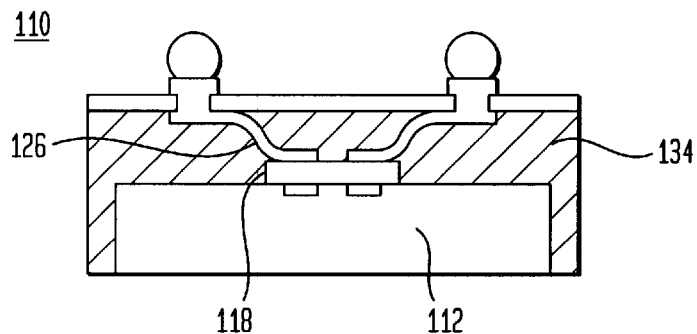
FIG. 3 is a side view of a semiconductor chip package with peelable leads and including an anisotropic conductive material according to another embodiment of the present invention.

The anisotropic conductive material 18 may be used in other types of semiconductor chip packages, as to be described in more detail. For example, FIG. 3 shows a "fan-in" semiconductor chip package 110 including an anisotropic conductive material 118 whereby the flexible leads 126 are peelable as disclosed in commonly assigned International Patent Publication WO 94/03036, the disclosure of which is incorporated by reference herein. The semiconductor chip package 110 is completed by encapsulation using an encapsulant 134 as thus far described.

Figure 4:
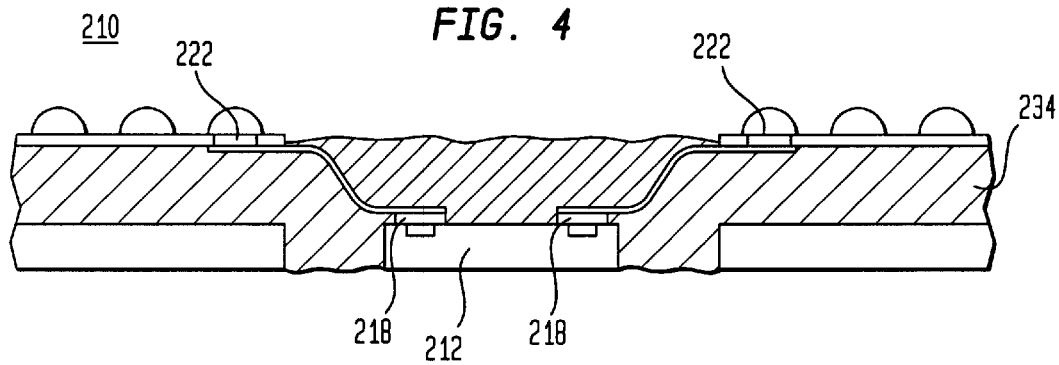
FIG. 4 shows a side view of a "fan-out" semiconductor chip package including an anisotropic conductive material according to still another embodiment of the present invention.

FIG. 4 shows a "fan-out" semiconductor chip package 210 including an anisotropic conductive material 218 which has terminals 222 outside the periphery of the chip 212 as disclosed in commonly assigned U.S. Pat. No. 5,688,716 and copending U.S. Application Ser. No. 08/365,749, the disclosures of which are incorporated by reference herein. The semiconductor chip package 210 is completed by encapsulation using an encapsulant 234 as thus far described.

Figure 5:
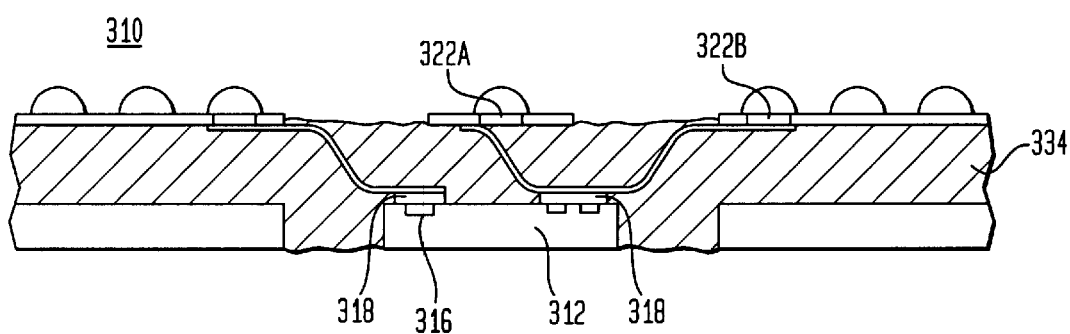
FIG. 5 shows a "fan-out/fan-in" semiconductor chip package including an anisotropic conductive material according to yet another embodiment of the present invention.

FIG. 5 shows a "fan-in/fan-out" semiconductor chip package 310 including an anisotropic conductive material 318 which has terminals 322A and 322B located both within and beyond the periphery of the chip 312 as disclosed in commonly assigned U.S. Pat. No. 5,148,265, the disclosure of which is incorporated by reference herein. The semiconductor chip package 310 is completed by encapsulation using an encapsulant 334 as thus far described.

Figure 6:
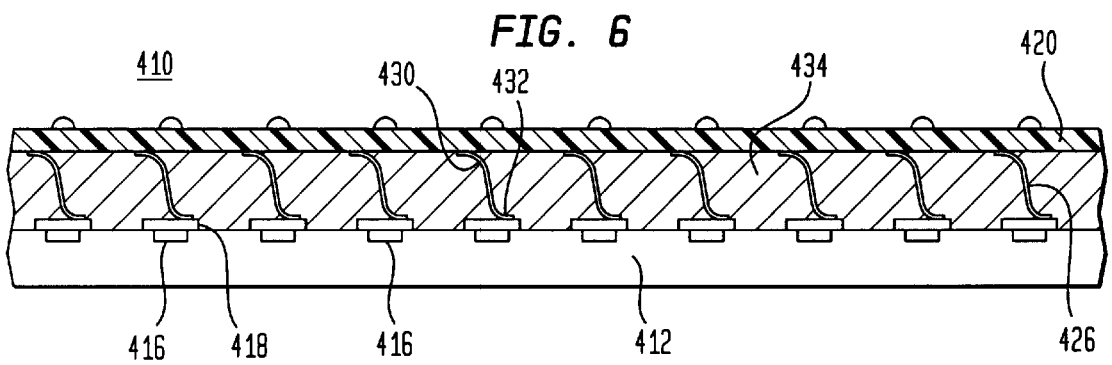
FIG. 6 shows a semiconductor wafer having an area array of contacts and including an anisotropic conductive material according to a further embodiment of the present invention.

FIG. 6 shows a wafer-level semiconductor chip assembly 410 having an area array of contacts 416 as disclosed in some embodiments of commonly assigned U.S. Pat. No. 5,518,964, the disclosure of which is hereby incorporated by reference herein. In this embodiment, a flexible dielectric sheet 420 is provided having an area array of elongated strip-like flexible leads 426. Each lead 426 has a terminal end 430 permanently fastened to the dielectric sheet 420 and a tip end 432 which is detachable from the flexible dielectric sheet 420. An anisotropic conductive material 418 is provided over substantially all of the contacts 416 on a semiconductor wafer 412. The flexible dielectric sheet 420 is then juxtaposed with the semiconductor wafer 412 so that the tip ends 432 of all of the leads 426 are aligned with the contacts 416 of the semiconductor wafer 412. The tip ends 432 of the flexible leads are then attached to the anisotropic material 418 by pushing the tip ends 432 into the anisotropic conductive material 418, thereby creating an electrical interconnection between the flexible leads 426 and the contacts 416. After the tip ends 432 are connected to the anisotropic material 418, an encapsulant material 434 substantially similar to that described above, is introduced between the flexible dielectric sheet 420 and the semiconductor wafer 412 so that the sheet 420 moves away from the wafer 412 to advance the tip ends 432 of each lead 426 vertically away from the flexible dielectric sheet 420 so as to deform the leads 426 into a flexible, s-shaped configuration. The wafer 412 may then be transferred to an oven for curing the encapsulant material 434. The above-described process may also be used for a single chip having an area array.

Figure 7:
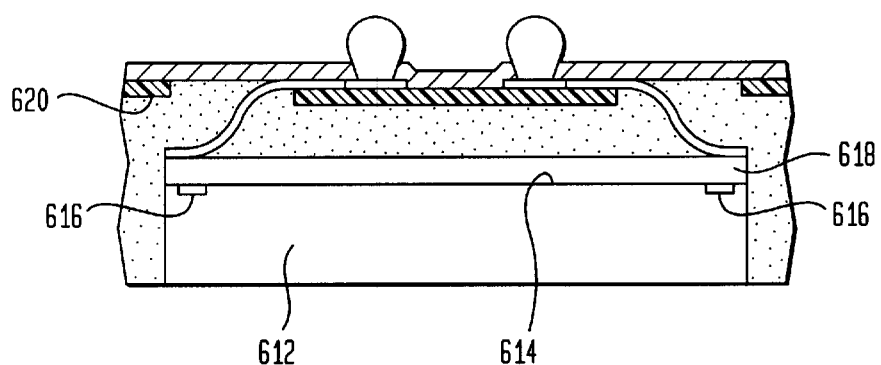
FIG. 7 is a side view of a semiconductor chip including a layer of an anisotropic conductive material provided over substantially all of the contacts of a microelectronic element.

FIG. 7 shows a compliant semiconductor chip package 610 which is substantially similar to the embodiment shown in FIG. 1. However, in this particular embodiment the anisotropic conductive material 618 is a continuous layer provided over the front face 614 of the chip 612. The continuous layer 618 covers substantially all of the chip contacts 616.

Figure 8:
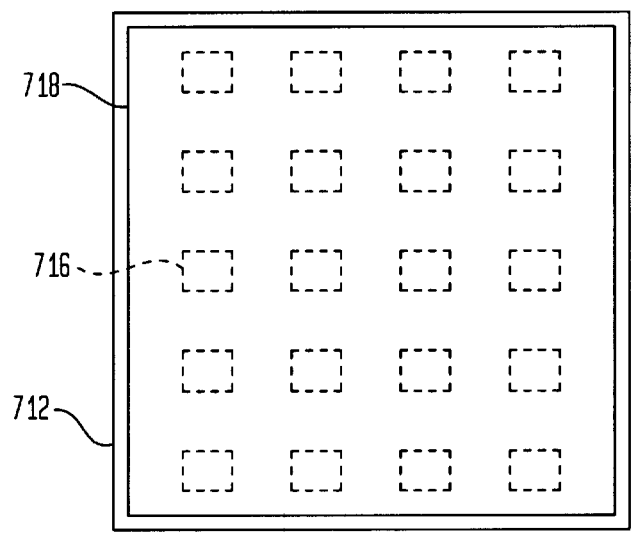
FIG. 8 shows a front view of a semiconductor chip having an area array of contacts and including a continuous layer of an anisotropic conductive material over the contacts according to still further embodiments of the present invention.

FIG. 8 shows another embodiment of the present invention wherein a continuous layer of anisotropic conductive material 718 is provided over a semiconductor chip 712 having an area array of contacts 716. The chip 712 may be electrically connected to a connection component (not shown) using the techniques described above.

Figure 9:
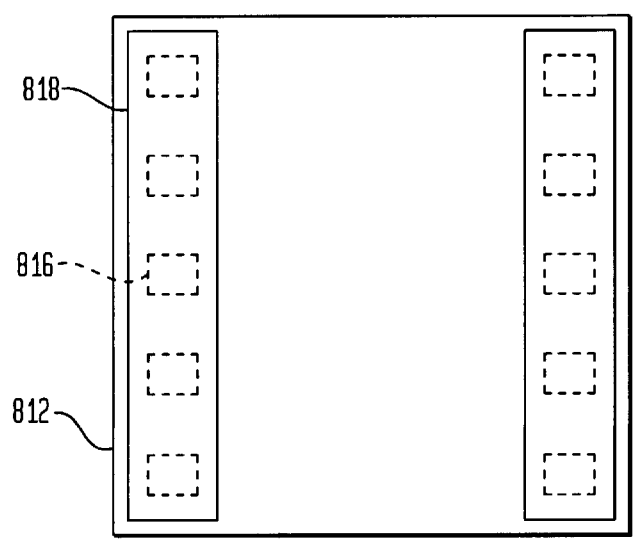
FIG. 9 shows a front view of a semiconductor chip having rows of contacts and including strips of an anisotropic conductive material over the rows of contacts according to yet further embodiments of the present invention.

FIG. 9 shows yet another embodiment of the present invention wherein strips of anisotropic conductive material 818 are provided over the front face of a semiconductor chip 816 having rows of contacts. The chip 812 may be electrically connected to a connection component (not shown) using the techniques described above.

Although the invention herein has been described with reference to particular embodiments, it is to be understood that these embodiments are merely illustrative of the principles and application of the present invention. It is therefore to be understood that numerous modifications may be made to the illustrative embodiments and that other arrangements may be devised without departing from the spirit and scope of the present invention as defined by the appended claims.

What is claimed:

1. A method of making a microelectronic package comprising:

providing a first microelectronic element having a front face including a plurality of contacts;

providing an anisotropic conductive material over each one of said plurality of contacts;

providing a second microelectronic element having terminals accessible at a surface thereof and including a plurality of flexible leads, each said lead having a terminal end attached to one of said terminals and a tip end offset from said terminal end;

juxtaposing said first and second microelectronic elements with one another;

electrically interconnecting said tip ends of said flexible leads with said anisotropic conductive material on said contacts so that said flexible leads extend away from said second microelectronic element with said anisotropic conductive material interposed between said tip ends and said contacts;

displacing said first and second microelectronic elements away from each other in a vertical direction whereby said tip ends of said leads are displaced in a vertical direction from said terminal ends of said leads.

2. A method as claimed in claim 1, wherein said electrically interconnecting includes moving said tip ends of said leads into engagement with said anisotropic conductive material over said contact.

3. A method as claimed in claim 2, wherein said flexible leads extend generally vertically away from said second microelectronic element after said moving step.

4. A method as claimed in claim 1 further comprising injecting a curable material around said leads after said forming step and curing said curable material to thereby form a compliant layer around said leads.

5. A method as claimed in claim 4, wherein said curable material includes a flowable dielectric material.

6. A method as claimed in claim 4, wherein said injecting a curable material includes injecting the curable material between said first and second microelectronic elements.

7. A method of making a microelectronic package comprising:
   providing a first microelectronic element having a front face including a plurality of contacts;
   providing an anisotropic conductive material over each one of said plurality of contacts;
   providing a second microelectronic element having terminals accessible at a surface thereof and including a plurality of flexible leads, each said lead having a terminal end attached to one of said terminals and a tip end offset from said terminal end;
   juxtaposing said first and second microelectronic elements with one another;
   electrically interconnecting said tip ends of said flexible leads and said contacts so that said flexible leads extend away from said second microelectronic element upon displacing said first and second microelectronic elements away from each other in a vertical direction with said anisotropic conductive material interposed between said tip ends and said contacts, said tip ends of said leads being displaced vertically from said terminal ends of said leads, and wherein said electrical interconnecting includes pushing said tip ends of said flexible leads into said anisotropic conductive material 24.

8. A method as claimed in claim 7, wherein said pushing includes applying heat and pressure to said tip ends of said flexible leads and said anisotropic conductive material.

9. A method of making a microelectronic package comprising:
   providing a first microelectronic element having a front face including a plurality of contacts;
   providing an anisotropic conductive material over each one of said plurality of contacts;
   providing a second microelectronic element having terminals accessible at a surface thereof and including a plurality of flexible leads, each said lead having a terminal end attached to one of said terminals and a tip end offset from said terminal end;
   juxtaposing said first and second microelectronic elements with one another;
   electrically interconnecting said tip ends of said flexible leads and said contacts so that said flexible leads extend away from said second microelectronic element upon displacing said first and second microelectronic elements away from each other in a vertical direction with said anisotropic conductive material interposed between said tip ends and said contacts, said tip ends of said leads being displaced vertically from said terminal ends of said leads, and wherein said electrical interconnecting includes sinking said tip ends of said flexible leads into said anisotropic conductive material.

10. A method as claimed in claim 9, wherein said sinking includes applying heat and pressure to said tip ends of said flexible leads and said anisotropic conductive material.

11. A method of making a microelectronic package comprising:
   providing a first microelectronic element having a front face including a plurality of contacts;
   providing an anisotropic conductive material over each one of said plurality of contacts;
   providing a second microelectronic element having terminals accessible at a surface thereof and including a plurality of flexible leads, each said lead having a terminal end attached to one of said terminals and a tip end offset from said terminal end;
   juxtaposing said first and second microelectronic elements with one another;
   electrically interconnecting said tip ends of said flexible leads and said contacts so that said flexible leads extend away from said second microelectronic element with said anisotropic conductive material interposed between said tip ends and said contacts; wherein said electrically interconnecting includes:
      aligning said tip ends of said leads and said contacts of said first microelectronic element;
      abutting said tip ends of said leads against said anisotropic conductive material so that said tip ends are attached to said anisotropic material;
      simultaneously displacing all of said tip ends of said leads relative to the terminal ends and said second microelectronic element so as to bend said tip ends generally vertically away from said second microelectronic element.

12. A method as claimed in claim 11, wherein said tip ends of said leads are initially secured to said second microelectronic element and said tip ends of said leads are detached from said second microelectronic element during said displacing.

13. A method as claimed in claim 11 further comprising injecting a curable material around said leads after said forming and curing said curable material to thereby form a compliant layer around said leads.

14. A method as claimed in claim 13, wherein said curable material includes a flowable dielectric material.

15. A method as claimed in claim 13, wherein said injecting a curable material includes injecting the curable material between said first and second microelectronic elements.

16. A method of making a microelectronic package comprising:
   providing a first microelectronic element having a front face including a plurality of contacts;
   providing an anisotropic conductive material over each one of said plurality of contacts;
   providing a second microelectronic element having terminals accessible at a surface thereof and including a plurality of flexible leads, each said lead having a terminal end attached to one of said terminals and a tip end offset from said terminal end;
   juxtaposing said first and second microelectronic elements with one another;
   electrically interconnecting said tip ends of said flexible leads and said contacts so that said flexible leads extend away from said second microelectronic element with said anisotropic conductive material interposed between said tip ends and said contacts;

simultaneously displacing all of said tip ends of said leads relative to the terminal ends and said second microelectronic element so as to bend said tip ends generally vertically away from said second microelectronic element.

* * * * *

UNITED STATES PATENT AND TRADEMARK OFFICE
CERTIFICATE OF CORRECTION

PATENT NO.    : 6,468,830 B1
DATED         : October 22, 2002
INVENTOR(S)   : Flynn Carson It is certified that error appears in the above-identified patent and that said Letters Patent is hereby corrected as shown below:

Column 1,
Line 46, "closelyspaced" should read -- closely-spaced --.

Column 5,
Line 36, "Niplated" should read -- Ni-plated --.

Column 9,
Line 6, "contact" should read -- contacts --.
Line 44, delete "24".

Signed and Sealed this

Twenty-ninth Day of April, 2003

JAMES E. ROGAN
*Director of the United States Patent and Trademark Office*